(12) United States Patent
Jung et al.

(10) Patent No.: US 9,589,788 B2
(45) Date of Patent: Mar. 7, 2017

(54) POLYMER WITH A GOOD HEAT RESISTANCE AND STORAGE STABILITY, UNDERLAYER FILM COMPOSITION CONTAINING THE POLYMER AND PROCESS FOR FORMING UNDERLAYER FILM USING THE COMPOSITION

(71) Applicants: SK Innovation Co., Ltd., Seoul (KR); SK Global Chemical Co., Ltd., Seoul (KR)

(72) Inventors: Min Ho Jung, Daejeon (KR); Jeong Eop Choi, Daejeon (KR); Hye Ryoung Lee, Daejeon (KR)

(73) Assignees: SK Innovation Co., Ltd., Seoul (KR); SK Global Chemical Co., Ltd., Seoul (KR)

( * ) Notice: Subject to any disclaimer, the term of this patent is extended or adjusted under 35 U.S.C. 154(b) by 0 days.

(21) Appl. No.: 15/178,597

(22) Filed: Jun. 10, 2016

(65) Prior Publication Data

US 2016/0365242 A1 Dec. 15, 2016

(30) Foreign Application Priority Data

Jun. 11, 2015 (KR) .................. 10-2015-0082470
May 25, 2016 (KR) .................. 10-2016-0063864

(51) Int. Cl.
*H01L 21/31* (2006.01)
*H01L 21/02* (2006.01)
(Continued)

(52) U.S. Cl.
CPC ......... *H01L 21/02118* (2013.01); *C08G 8/02* (2013.01); *C09D 161/16* (2013.01);
(Continued)

(58) Field of Classification Search
CPC ..... C09K 11/06; H01L 51/00; H01L 51/0056; H01L 51/0064; H01L 51/0067; H01L 51/0073
(Continued)

(56) References Cited

U.S. PATENT DOCUMENTS 4,092,162 A * 5/1978 Wright ............... C08G 63/6858
430/57.2
2007/0275325 A1 11/2007 Hatakeyama et al.
2012/0146005 A1* 6/2012 Yang .................. C08G 73/0644
257/40

FOREIGN PATENT DOCUMENTS

KR 1020140123368 A 10/2014

* cited by examiner

*Primary Examiner* — Brook Kebede
(74) *Attorney, Agent, or Firm* — The Webb Law Firm

(57) ABSTRACT

Provided are a polymer for an underlayer film, used in semiconductor and display manufacturing processes, an underlayer film composition for semiconductor and display manufacturing processes, containing the same, and a method for forming an underlayer film for semiconductor and display manufacturing processes using the underlayer film composition. The polymer according to the present invention is a polymer including a repeating unit represented by the following Chemical Formula 1:

[Chemical Formula 1]

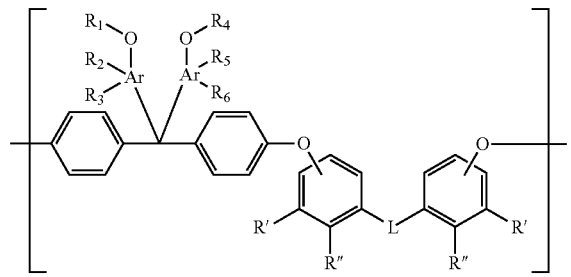

in Chemical Formula 1, Ar, $R_1$ to $R_6$, L, and R' and R" are the same as those in the detailed description of the present invention.

11 Claims, 1 Drawing Sheet

(51) Int. Cl.
  *C08G 8/02*      (2006.01)
  *C09D 161/16*    (2006.01)
  *H01L 21/027*    (2006.01)
  *G03F 7/11*      (2006.01)
  *C08K 5/3445*    (2006.01)

(52) U.S. Cl.
  CPC ............ G03F 7/11 (2013.01); H01L 21/0274 (2013.01); H01L 21/02282 (2013.01); H01L 21/02345 (2013.01); *C08G 2150/00* (2013.01); *C08K 5/3445* (2013.01)

(58) Field of Classification Search
  USPC ........................................................ 438/781
  See application file for complete search history.

POLYMER WITH A GOOD HEAT RESISTANCE AND STORAGE STABILITY, UNDERLAYER FILM COMPOSITION CONTAINING THE POLYMER AND PROCESS FOR FORMING UNDERLAYER FILM USING THE COMPOSITION

CROSS-REFERENCE TO RELATED APPLICATIONS

This application claims priority to Korean Patent Application Nos. 10-2015-0082470 and 10-2016-0063864 filed Jun. 11, 2015 and May 25, 2016, respectively, the disclosures of which are hereby incorporated in their entirety by reference.

TECHNICAL FIELD

The following disclosure relates to a polymer having a novel structure, used in semiconductor and display manufacturing processes, an underlayer film composition for semiconductor and display manufacturing processes containing the same, and a method for forming an underlayer film for semiconductor and display manufacturing processes using the composition. More particularly, since a novel polymer according to the present invention simultaneously may have optimized etch selectivity and planarization characteristics, such that the underlayer film composition containing the polymer may be used as a hard mask in a multilayer semiconductor lithography process.

BACKGROUND

As a size of a pattern has rapidly decreased in accordance with miniaturization and high integration of a semiconductor device, a collapse phenomenon of a photoresist pattern has been in the spotlight as the biggest difficulty in a process, and thus, necessarily, a thickness of the photoresist film has gradually decreased in order to have high resolution. However, it has been significantly difficult to etch a layer to be etched with sufficient etch selectivity using a thinned photoresist and a formed pattern, and thus, an inorganic or organic film having high etching resistance has been introduced between the photoresist and the layer to be etched. This film is referred to as a hard mask, and generally, a hard mask process is a process of etching the hard mask using a photoresist pattern to form a pattern and etching the layer to be etched using a pattern of the hard mask. A material of the hard mask used in the hard mask process may be various. For example, polysilicon, silicon nitride, silicon oxynitride, titanium nitride, amorphous carbon, or the like, may be used, and generally, the hard mask is manufactured by a chemical vapor deposition (CVD) method.

The hard mask formed by the chemical vapor deposition method has excellent physical properties in view of etch selectivity or etching resistance, but there are problems such as formation of particles, voids at a portion at which a step is large, and the like. Particularly, high initial equipment investment cost is the point of the matter. In order to solve these problems, there is a need to develop a spin on hard mask composition capable of being easily spin coated using a track coater used in a photo process in a semiconductor line instead of the deposition-type hard mask, and a specific material for the spin on hard mask composition has been developed in earnest. In the case of a hard mask (spin on hard mask) formed through the spin coating, it is difficult to have the same performance as the hard mask through the CVD process in view of etching resistance, but there are advantages in that it may be easy to form a thin film through coating in a solution state, coating uniformity may be improved, and roughness of a surface of the thin film may be decreased, etc. Further, there is an advantage in that initial investment cost is low as compared to the chemical vapor deposition method.

As described above, recently, there is a limitation in implementing fineness of a lithography process in accordance with continuous high integration of a large scale integrated circuit (LSI) even with an existing argon fluoride liquid immersion exposure photoresist, which is the most advanced resist. Particularly, in order to perform a process for an ultra-fine pattern for 30 nm node or less, resolution of a photoresist used in the lithography process serves as a critical and important factor. However, there is a limitation in implementing a pattern of 30 nm or less using the existing photoresist, and in order to solve this problem, a novel additional process has been developed.

As a technology actually applied in a process among various process technologies developed up to now, a double patterning method of performing an exposure process and performing an etching process two times and a double spacer patterning process (SPT) have been mainly used, and a material used for the hard mask in this additional process is commonly referred to as an underlayer film composition. However, a use amount of the underlayer film composition as a novel material for the hard mask has been rapidly increased in a situation in which the underlayer film composition has been used for the hard mask instead of previously used amorphous carbon, and the double patterning process, a process for implementing high resolution, leads the overall ArF lithography process. As the most important physical properties required in the underlayer film as described above, there are excellent coating uniformity in addition to properties such as high etching resistance and heat stability, excellent solubility for a general organic solvent, storage stability, adhesion, and the like. The reason of requiring heat stability is that after forming the underlayer film, a vacuum deposition process is performed thereon at a high temperature as a subsequent process. In general, a low polymer decomposition rate at 400° C. and a film decrease rate of 5% or less are required as heat resistance properties for a stable vacuum deposition process. Etching resistance is another significantly important factor for etching a lower layer with a minimum thickness as the underlayer film. The reason is that the thicker the thickness of the film, the higher the risk that a pattern will naturally fall down during a process. The higher the content of carbon in the polymer, the more advantageous in view of etching resistance, but in consideration of solubility in a solvent and coating uniformity, it is preferable that the content of carbon is 82% or more.

According to the related art, in order to satisfy properties of a material of the underlayer film, as a polymer material in the composition, a polymer having a high content of carbon, high polarity, and high heat stability has been mainly studied. Particularly, various research into polyamide, polyether ether ketone, polyarylether, other phenolic polymers, and the like, has been conducted. It was confirmed that some of the polymers had sufficient high-temperature stability and a film-forming ability. However, when polymers have desired level of carbon contents related with etching resistance, the polymers have problems in view of storage stability, line compatibility, and coating uniformity due to rapid decrease in solubility. When polymers have insufficient heat resistance, the polymers have a problem in that a gas emission amount is large during the process due to low heat stability.

That is, physical properties of the underlayer film composition are dependent on characteristics of the polymer. In particular, heat stability and etching resistance in the characteristics of the polymer are intactly reflected in the characteristics of the underlayer film composition. Heat stability is dependent on stability of a polymer main chain, and the etching resistance is excellent as a carbon content present in the polymer is high. As a polymer having excellent heat resistance, there are polyimide, polyamide, polyaryl ketone ether, and the like, but these polymers have low etching resistance or low solubility in a general organic solvent, such that there is a limitation in using these polymers as a material of the underlayer film.

RELATED ART DOCUMENT

Patent Document (Patent Document 1) Korean Patent Laid-Open Publication No. 10-2014-0123368
(Patent Document 2) U.S. 2007-0275325A1

SUMMARY

The present inventors succeeded in preparing a novel polymer deformed using polyarylketone ether in order to solve the above-mentioned problems and confirmed that in the case of the novel polymer, etching resistance was excellent, heat stability was excellent, and coating uniformity was also satisfactory, and particularly, in spite of a high content of carbon, solubility in an organic solvent generally used in a semiconductor process was high, such that storage stability and line compatibility were remarkably improved, thereby completing the present invention.

An embodiment of the present invention is directed to providing a polymer for forming an underlayer film, having excellent heat resistance, etching resistance, and coating uniformity, an underlayer film composition containing the polymer, and a method for forming an underlayer film using the underlayer film composition.

In one general aspect, there is provided a polymer including a repeating unit represented by the following Chemical Formula 1:

[Chemical Formula 1]

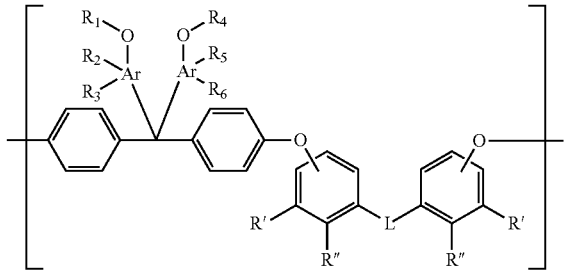

in Chemical Formula 1,
Ar is (C6-C20)arylene;
$R_1$ to $R_6$ are each independently hydrogen, (C1-C20)alkyl, nitrile, or (C6-C20)arylmethyl, at least one of $R_1$ to $R_6$ being (C6-C20)arylmethyl;
L is a single bond, (C1-C10)alkylene, or (C6-C20)arylene, alkylene and arylene of L being further substituted with one or more substituents selected from (C1-C20)alkyl, (C6-C20)aryl, and (C1-C20)alkoxy; and
R' and R" are each independently hydrogen, (C1-C20)alkyl, (C1-C20)alkoxy, or (C6-C20)aryl, or may be linked to each other via (C2-C10)alkenylene to form a fused ring.

In addition, in another general aspect, there is provided an underlayer film composition for semiconductor and display manufacturing processes containing a polymer including a repeating unit represented by Chemical Formula 1.

Further, in another general aspect, there is provided a method for forming an underlayer film for semiconductor and display manufacturing process including: applying an underlayer film composition for semiconductor and display manufacturing processes, containing a polymer including a repeating unit represented by Chemical Formula 1 on a wafer; and baking the wafer on which the underlayer film composition is applied.

DETAILED DESCRIPTION OF EMBODIMENTS

Figure 1:
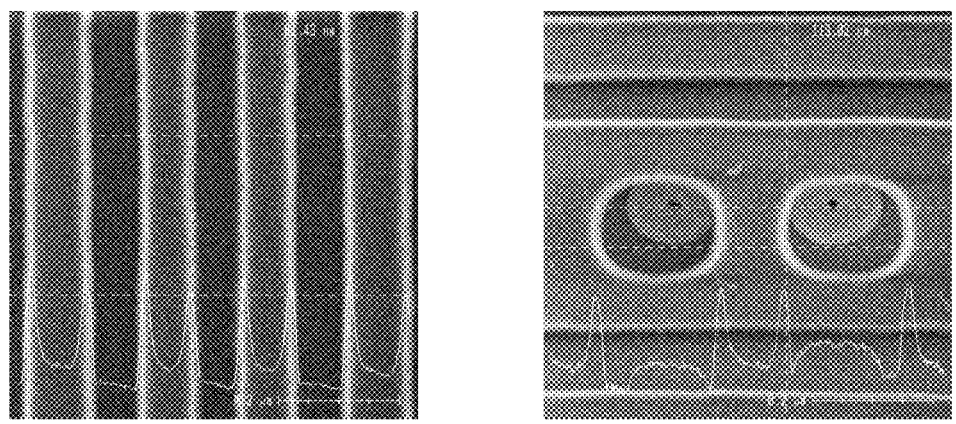
FIG. 1 shows mask CD point images after a photolithography process.

Hereinafter, the present invention will be described in detail.

The present invention provides a polymer including a repeating unit represented by the following Chemical Formula 1, as a core material for forming an underlayer film composition having excellent physical properties used in semiconductor and display manufacturing processes.

[Chemical Formula 1]

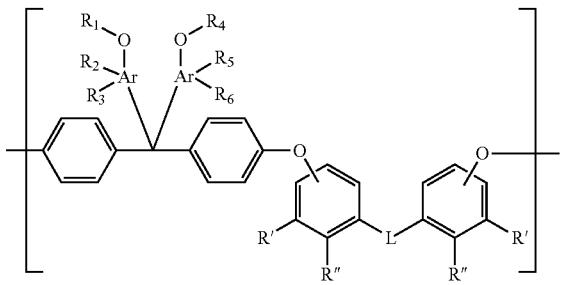

in Chemical Formula 1,
Ar is (C6-C20)arylene;
$R_1$ to $R_6$ are each independently hydrogen, (C1-C20)alkyl, nitrile, or (C6-C20)arylmethyl, at least one of $R_1$ to $R_6$ being (C6-C20)arylmethyl;
L is a single bond, (C1-C10)alkylene, or (C6-C20)arylene, alkylene and arylene of L being further substituted with one or more substituents selected from (C1-C20)alkyl, (C6-C20)aryl, and (C1-C20)alkoxy; and
R' and R" are each independently hydrogen, (C1-C20)alkyl, (C1-C20)alkoxy, or (C6-C20)aryl, or may be linked to each other via (C2-C10)alkenylene to form a fused ring.

As disclosed herein, the terms ⌈alkyl⌋ and ⌈alkoxy⌋ include both of the straight chain type and the branched chain type.

As disclosed herein, the term ⌈aryl⌋, which is an organic radical derived from aromatic hydrocarbon by removing one hydrogen atom therefrom, may include a single ring or a fused ring containing, properly 4 to 7 ring atoms, and preferably 5 or 6 ring atoms, and include rings in which two or more aryls are combined through single bond(s). Specific examples of the aryl radical include aromatic groups such as phenyl, naphthyl, biphenyl, indenyl, fluorenyl, phenanthrenyl, anthracenyl, triphenylenyl, pyrenyl, chrysenyl, and naphthacenyl.

The polymer according to the present invention has a weight average molecular weight (Mw) of 500 or more, but in view of improving coating uniformity, hole-filling characteristics, and solubility, it is preferable that the polymer may have a weight average molecule weight of 500 to 20,000.

In the polymer according to the present invention, at least one of $R_1$ to $R_6$, preferably, at least two of $R_1$ to $R_6$, and more preferably, at least four of $R_1$ to $R_6$ are (C6-C20)arylmethyl.

A substitution amount of (C6-C20)aralkyl in the polymer may be 10 to 50 mol % based on the weight average molecular weight of the polymer.

In the polymer according to the present invention, Ar may be phenylene, naphthylene, or anthrylene; $R_1$ to $R_6$ may be each independently hydrogen, methyl, nitrile, benzyl, naphthylmethyl, anthrylmethyl, or pyrenylmethyl; L may be a single bond,

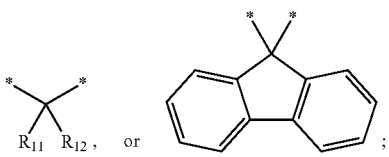

$R_{11}$ and $R_{12}$ may be each independently methyl, ethyl, propyl, or phenyl; and R' and R" may be each independently hydrogen or be linked to each other via C4alkenylene to form a fused ring.

In the polymer according to the present invention, Ar may be phenylene or naphthylene; $R_1$ to $R_6$ may be each independently hydrogen or benzyl; L may be

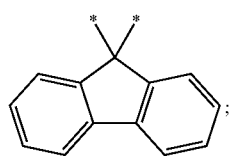

and R' and R" may be each independently hydrogen or be linked to each other via C4alkenylene to form a fused ring.

The polymer according to the present invention has excellent etching resistance, heat stability, and coating uniformity, and simultaneously has optimized etch selectivity and planarization characteristics, such that the polymer may be used as a material of a hard mask in a multilayer semiconductor lithography process. In addition, since the polymer contains a number of arylmethyl groups, in spite of a high content of carbon, the polymer has excellent solubility in an organic solvent, thereby making it possible to improve storage stability.

The present invention is intended to achieve excellent solubility characteristics in a general organic solvent by alkylation of the polymer in order to allow the polymer to have excellent solubility while having a high content of carbon. To this end, in the present invention, a novel heat-resistant polymer having the repeating unit represented by Chemical Formula 1 is prepared, and it was confirmed that at the time of evaluating an underlayer film composition containing the prepared polymer, etching resistance, heat stability, and coating uniformity were excellent. Particularly, it was also confirmed that in spite of a high content of carbon, the polymer had excellent solubility in an organic solvent, such that storage stability and line compatibility in a semiconductor process were significantly improved. An underlayer film composition having excellent physical properties as described above may be prepared using the polymer including the repeating unit represented by Chemical Formula 1.

The polymer according to the present invention may be synthesized by a chemical reaction known in the art, and examples of a preparation process thereof are illustrated in the following Reaction Schemes 1 to 3, but are not limited thereto.

As illustrated in the following Reaction Schemes 1 to 3, the polymer may be prepared by three-step reactions including: 1) preparing polyarylketone ether (P1) using a phenolic compound (S1) and 4,4'-dichlorobenzophenone (S2); 2) preparing a polymer having hydroxyl groups by reacting a ketone functional group of the prepared polyarylketone ether (P1) with a phenol derivative; and 3) preparing a polymer (P3) including the repeating unit represented by Chemical Formula 1 by introducing an arylmethyl group into the polymer prepared in step 2) in order to improve solubility characteristics while increasing etching resistance and the content of carbon.

As illustrated in the following Reaction Scheme 1, the polyarylketone ether polymer (P1) may be synthesized using the phenolic compound (S1) having two hydroxyl groups and 4,4'-dichlorobenzophenone (S2). A generally used reaction catalyst is a basic compound, and examples thereof may include $K_2CO_3$, NaOH, KOH, LiOH, and the like. This polymer has low solubility in an organic solvent, such that it is advantageous to use a polymerization regulator (S3). A phenol derivative having one hydroxyl group is used as the polymerization regulator, which may be helpful to etching resistance, and examples of the phenol derivative may include phenol, naphthol, pyrenol, anthracenol, and the like.

[Reaction Scheme 1]

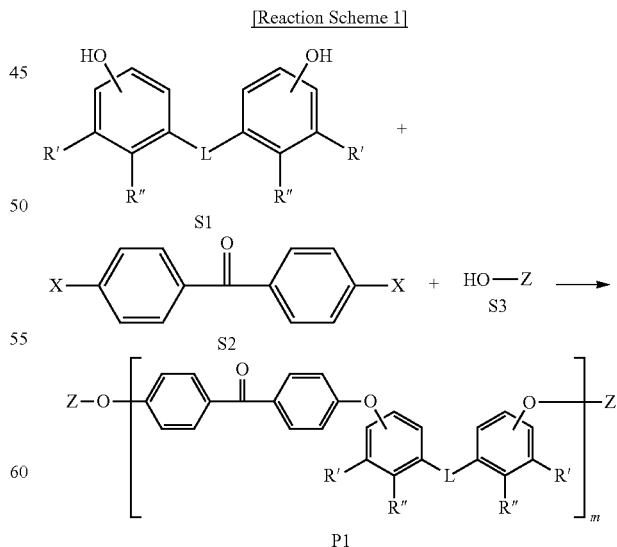

[In Reaction Scheme 1, R', R", and L are the same as defined in Chemical Formula 1, X is halogen, Z is (C6-C20) aryl, and m is an integer of 1 or more.]

Specific examples of the phenol derivative (S1) having two hydroxyl groups suitable for preparing polyarylketone ether may include phenol derivatives represented by the following structures but are not limited thereto.

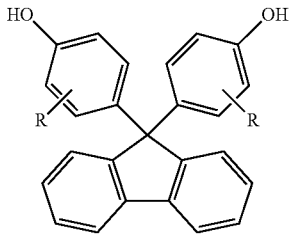

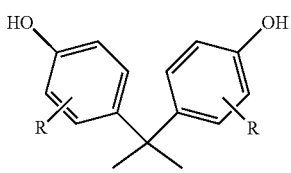

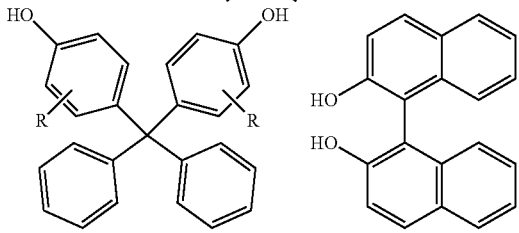

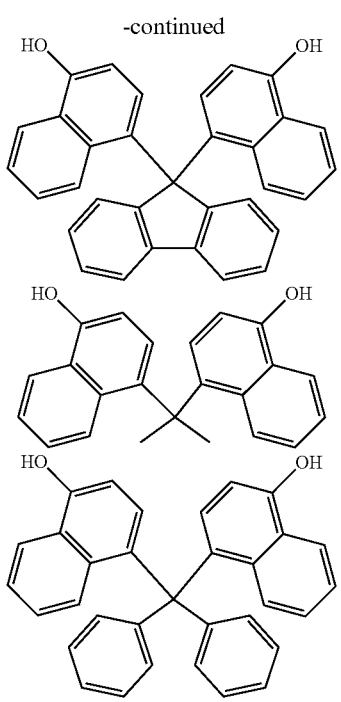

R(s) are each independently hydrogen, (C1-C20)alkyl, (C1-C20)alkoxy, or (C6-C20)aryl.

In general, it is known that the ketone functional group of polyarylketone ether (P1) has excellent reactivity. In the case in which polyarylketone ether reacts with a phenol derivative (S4) in the presence of a strong acid catalyst, a reaction with the ketone function group occurs at an ortho or para position of the phenols. As a specific example, this reaction is represented by the following Reaction Scheme 2.

[Reaction Scheme 2]

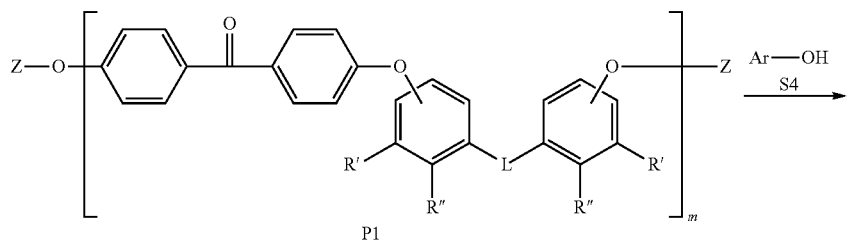

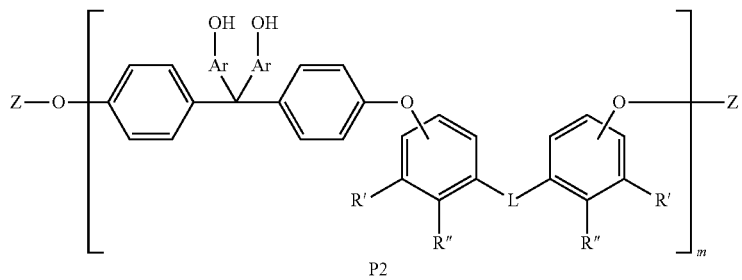

[In Reaction Scheme 2, R', R", and L are the same as defined in Chemical Formula 1, Ar is (C6-C20)arylene, Z is (C6-C20)aryl, and m is an integer of 1 or more.]

The polymer (P2) obtained in Reaction Scheme 2 may also be used as a material of an underlayer film, but in order to additionally improve etching resistance of the polymer (P2), there is a need to further increase a content of carbon. As a substitution amount of an arylmethyl group such as a benzyl group is increased, a content of carbon in a compound is increased. When the content of carbon is increased, dry etching resistance may be improved, such that there is no need to excessively increase a thickness of a coating film. In order to further increase the content of carbon, the benzyl group may be further introduced, or an arylmethyl derivative having a large aryl group such as a naphthalenemethyl group may be introduced. Solubility as well as etching resistance may be significantly improved by partially introducing the arylmethyl group in order to increase the content of carbon. A reaction for introducing the arylmethyl group may be performed by reacting arylmethylalcohol (S5) or arylmethylmethylether (S6) in the presence of a strong acid. As a specific example, this reaction is represented by the following Reaction Scheme 3.

halide, a Lewis acid such as trichloroaluminum may also be used. A usage amount of the acid catalyst may be 0.01 wt % to 10 wt % based on a total weight of the reactants. When the usage amount is excessively small, a reaction rate may be decreased, and when the usage amount is excessively large, it is difficult to remove the acid catalyst. In general, a preferable usage amount of the acid catalyst is 0.1 wt % to 5 wt %.

An introduction reaction temperature of the arylmethyl group may be various from 80° C. to 200° C. However, in the case in which the introduction reaction temperature is lower than 110° C., the reaction rate may be excessively decreased, and in the case in which the introduction reaction temperature is higher than 170° C., the reaction rate may be excessively increased, and thus, a color may be excessively changed. A general reaction temperature may be preferably, 110° C. to 170° C., and more preferably, 150° C. or so.

In an introduction reaction of the arylmethyl group, a solvent may not be used, but in general, a halogen compound or an aromatic compound may be used as a solvent in the introduction reaction. However, the solvent used in the introduction reaction is not particularly limited. An example of the halogen compound may include chlorobenzene,

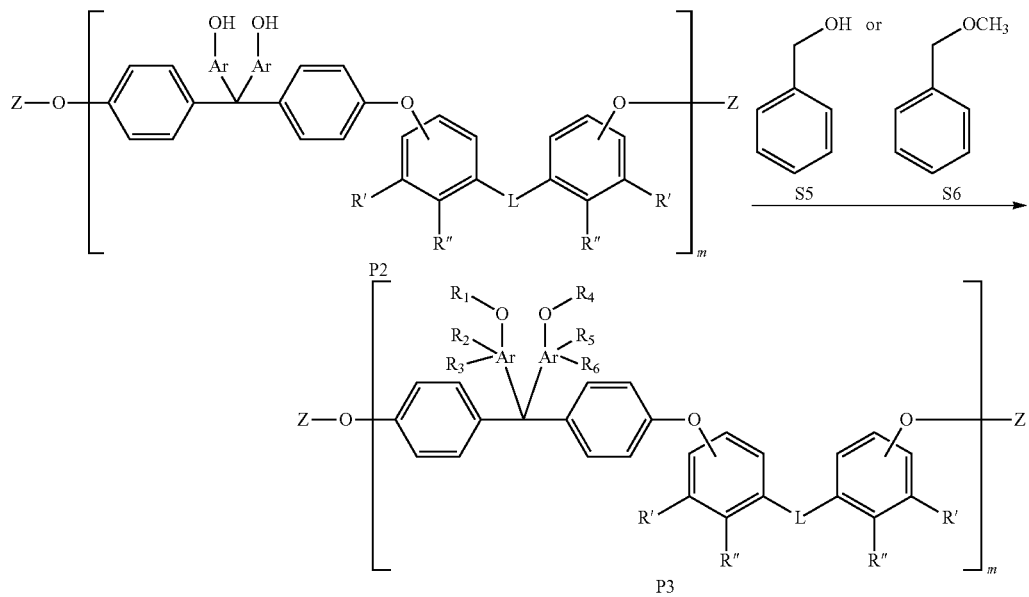

[Reaction Scheme 3]

[In Reaction Scheme 3, R', R", and L are the same as defined in Chemical Formula 1, $R_1$ to $R_6$ are each independently hydrogen or benzyl, at least one of $R_1$ to $R_6$ being benzyl, Ar is (C6-C20)arylene, Z is (C6-C20)aryl, and m is an integer of 1 or more.]

A method for introducing the arylmethyl group such as the benzyl group may be performed in the presence of an acid catalyst. Here, the used acid catalyst is not particularly limited, but the reaction may be performed using (C6-C20) aromatic sulfonic acids such as benzene sulfonic acid, toluene sulfonic acid, naphthalene sulfonic acid, and the like; (C1-C20)alkane sulfonic acids such as methane sulfonic acid, ethane sulfonic acid, propane sulfonic acid, and the like; sulfuric acid; hydrochloric acid; or perfluoro(C1-C20) alkane sulfonic acids such as trifluoromethane sulfonic acid, and the like. Of course, in the case of using arylmethyl dichlorobenzene, and the like, and an example of the aromatic compound may include benzene, toluene, xylene, and the like. After the reaction is terminated, the resultant is precipitated in hexane, a non-polar solvent, filtered, and then vacuum-dried, thereby obtaining a compound.

Further, the present invention provides an underlayer film composition for semiconductor and display manufacturing processes, containing a polymer including a repeating unit represented by Chemical Formula 1.

In the underlayer film composition according to an exemplary embodiment of the present invention, the polymer may have an amount of 1 to 50 wt %, preferably 2 to 30 wt %, and more preferably, 3 to 20 wt %, based on total amount of the underlayer film composition. When the amount of the polymer is less than 1 wt %, an underlayer film having a desired thickness may not be formed, and when the amount of the polymer is more than 50 wt %, the underlayer film may not be uniformly formed.

The underlayer film composition according to an exemplary embodiment of the present invention may form an underlayer film on the substrate such as a silicon wafer, or the like, by spin-coating, spin on carbon (SOC) methods, or the like. The underlayer film composition of the present invention includes the polymer including the repeating unit represented by Chemical Formula 1, thereby having excellent etching resistance, heat stability, coating uniformity, surface planarization, uniformity of pattern edges, and mechanical properties of patterns, such that the underlayer film composition of the present invention is applicable to a hard mask process or a planarization process of a wafer surface.

The underlayer film composition according to an exemplary embodiment of the present invention may further include an organic solvent in addition to the polymer including the repeating unit represented by Chemical Formula 1.

The underlayer film composition according to an exemplary embodiment of the present invention may further include at least one additive selected from crosslinking agents, acid catalysts, acid generators, antifoaming agents, and surfactants.

The polymer including the repeating unit represented by Chemical Formula 1 according to an exemplary embodiment of the present invention may be dissolved in the organic solvent to be coated on the wafer, and then, a crosslinking reaction may be performed at a high temperature by itself. However, the crosslinking reaction is generally performed by adding a crosslinking agent and a catalyst. The composition obtained after the polymer, the crosslinking agent, and the catalyst are dissolved in a solvent, is subjected to a filtration process so that particulate impurities are completely removed.

In the underlayer film composition according to an exemplary embodiment of the present invention, the organic solvent to be usable may be any organic solvent as long as the polymer including the repeating unit represented by Chemical Formula 1, the crosslinking agent, and the acid catalyst are easily dissolved therein. The organic solvent is an organic solvent generally used for a process for manufacturing a semiconductor, and cyclohexanone, 2-heptanone, propylene glycol monomethyl ether, propylene glycol monomethyl acetate, propylene glycol monomethyl ether acetate, gamma-butyrolactone, ethyl lactate, dimethylsulfoxide, dimethylacetamide, N-methylpyrrolidone, or the like, may be used. In addition, the surfactant may be additionally used in order to improve coating uniformity.

In the underlayer film composition according to an exemplary embodiment of the present invention, the crosslinking agent is to induce the crosslinking reaction to better cure the underlayer film. The crosslinking agent usable in the underlayer film composition of the present invention is not limited, but for example, at least one selected from compounds represented by the following Chemical Formulas 2 to 8 may be used.

[Chemical Formula 2]

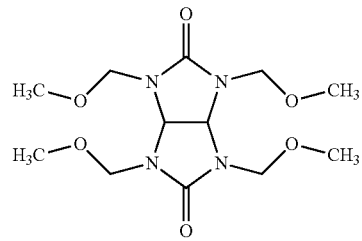

[Chemical Formula 3]

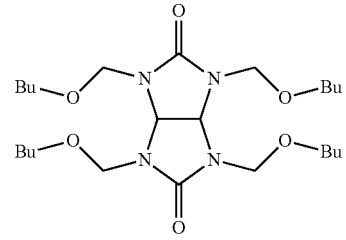

[Chemical Formula 4]

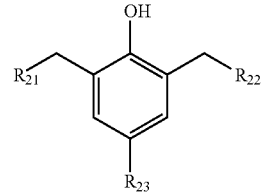

in Chemical Formula 4, $R_{21}$ and $R_{22}$ are each independently hydroxyl or (C1-C3)alkoxy, and $R_{23}$ is (C1-C10) alkyl,

[Chemical Formula 5]

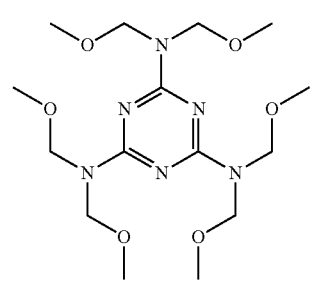

[Chemical Formula 6]

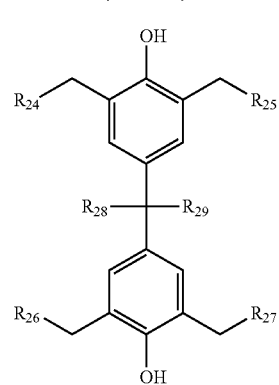

in Chemical Formula 6, $R_{24}$ to $R_{27}$ are each independently hydroxyl or (C1-C3)alkoxy, and $R_{28}$ and $R_{29}$ are each independently hydrogen, (C1-C10)alkyl, or halo(C1-C10) alkyl,

[Chemical Formula 7]

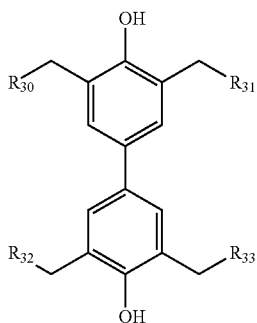

in Chemical Formula 7, $R_{30}$ to $R_{33}$ are each independently hydroxyl or (C1-C3)alkoxy, and

[Chemical Formula 8]

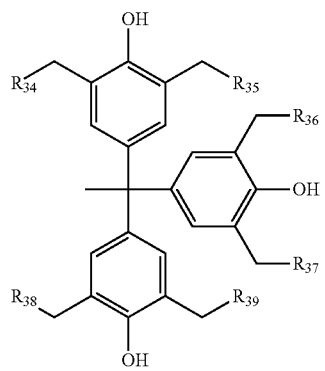

in Chemical Formula 8, $R_{34}$ to $R_{39}$ are each independently hydroxyl or (C1-C3)alkoxy.

In the underlayer film composition according to an exemplary embodiment of the present invention, a crosslinking agent to be usable may be specifically exemplified by the following structures:

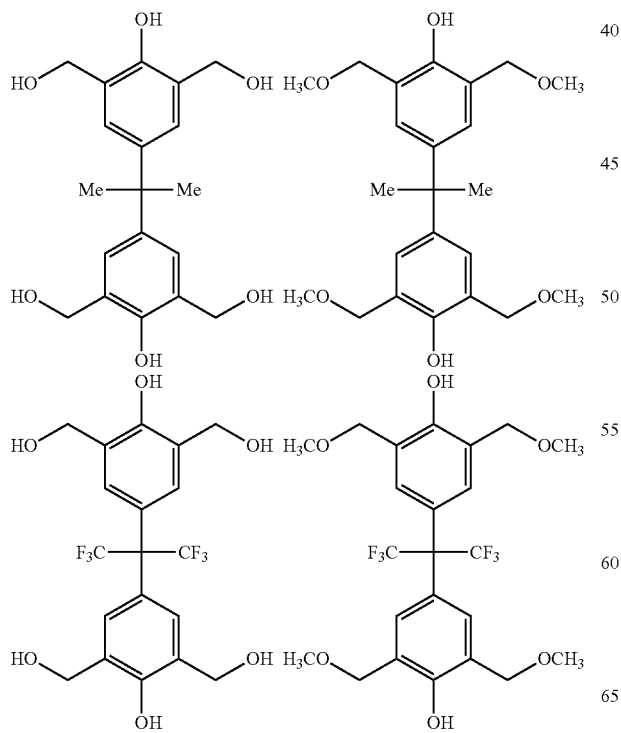

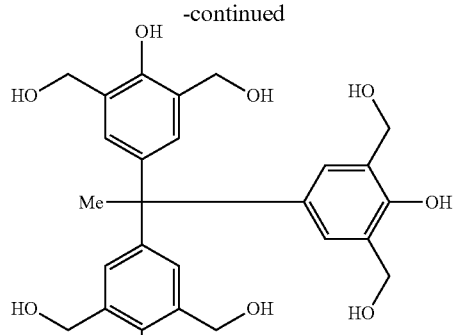

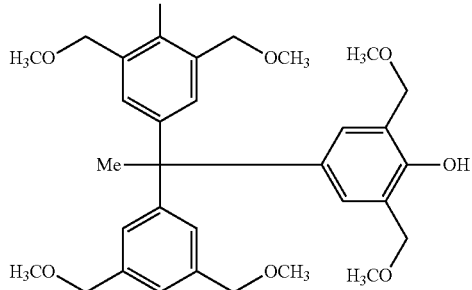

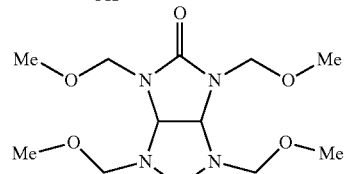

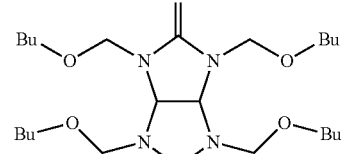

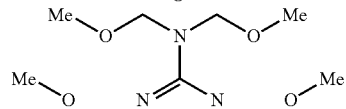

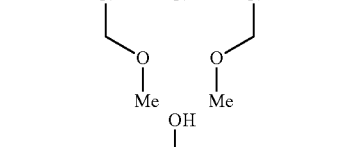

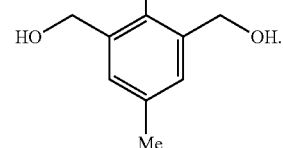

In the underlayer film composition according to an exemplary embodiment of the present invention, an amount of the crosslinking agent may be slightly different depending on the kinds of crosslinking agents, but the amount of the crosslinking agent may be 0.1 to 30 parts by weight based on 100 parts by weight of the polymer including the repeating unit represented by Chemical Formula 1 of the present invention. When the amount of the crosslinking agent is excessively small, crosslinking is not sufficiently performed, such that the crosslinking agent is dissolved in a solvent during a process of coating organic materials at an upper part, and when the amount of the crosslinking agent is excessively large, the crosslinking agent remains after the crosslinking, such that fume largely occurs. The amount of the crosslinking agent may be preferably, 0.1 to 20 parts by weight, and more preferably, 0.5 to 10 parts by weight based on 100 parts by weight of the polymer including the repeating unit represented by Chemical Formula 1.

In the underlayer film composition according to an exemplary embodiment of the present invention, a crosslinking catalyst may be used to increase a crosslinking speed in the crosslinking process. As the crosslinking catalyst, the acid catalyst or the acid generator more advantageously functions as compared to a basic catalyst.

In the composition for preparing the underlayer film composition according to an exemplary embodiment of the present invention, the acid catalyst or the acid generator is added to lower a temperature of the crosslinking reaction of the polymer and improve a crosslinking rate. The acid catalyst or the acid generator usable in the present invention is not limited, but for example, may be at least one selected from compounds represented by Chemical Formulas 9 to 14 below:

[Chemical Formula 9]
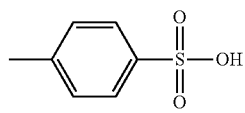

[Chemical Formula 10]
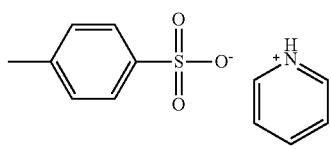

[Chemical Formula 11]
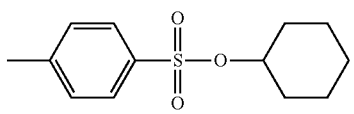

[Chemical Formula 12]
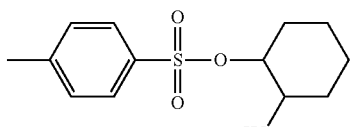

[Chemical Formula 13]
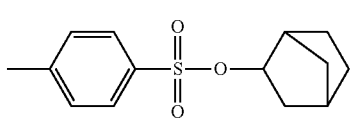

[Chemical Formula 14]
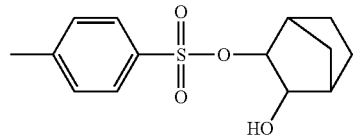

In the underlayer film composition according to an exemplary embodiment of the present invention, the acid catalyst may be divided into strong acids such as toluene sulfonic acid, and potential acid generators that are decomposed by heat to generate acid. In preparing the composition, it is preferred to use the potential acid generators rather than using the strong acids such as toluene sulfonic acid in view of storage stability. When the strong acids are used, storage stability of the underlayer film composition is decreased. An amount of the acid catalyst or the acid generator may be 0.01 to 10 parts by weight, preferably, 0.05 to 5 parts by weight, and more preferably, 0.1 to 5 parts by weight, based on 100 parts by weight of the polymer including the repeating unit represented by Chemical Formula 1. When the amount thereof is excessively small, a curing speed is slow. Meanwhile, when the amount thereof is excessively large, physical properties of a cured product may be decreased. In particular, when strength of the acid is large or great, fume largely occurs.

The underlayer film composition according to an exemplary embodiment of the present invention may have a film-forming property in which the film is capable of being formed by general spin-coating.

Further, the present invention provides a method for forming an underlayer film using the underlayer film composition. In detail, the method for forming the resist underlayer film according to an exemplary embodiment of the present invention may include: applying the underlayer film composition on a wafer; and baking the wafer on which the underlayer film composition is applied.

The underlayer film may be formed by spin coating the underlayer film composition and baking the wafer at 200° C. to 450° C. for 30 seconds to 3 minutes. The wafer subjected to a baking process is used for a subsequent process. In addition, a coating process, a thickness of the underlayer film, and a baking temperature and time are not limited to the above-mentioned ranges, but may be changed depending on the purpose.

Further, the present invention provides a method for forming patterns using the underlayer film composition. In detail, the method for forming patterns according to an exemplary embodiment of the present invention may include: 1) forming an underlayer film by using the underlayer film composition of the present invention on an upper part of a substrate to be etched such as a silicon wafer on which an aluminum layer is formed, or the like; 2) forming a photoresist layer on the upper part of the underlayer film; 3) exposing the photoresist layer to radiation with predetermined patterns to form patterns of a region exposed to the radiation on the photoresist layer; 4) selectively removing the photoresist layer and the underlayer film along the pattern to expose the substrate in a shape of the patterns; and 5) etching an exposed portion of the substrate.

In the method for forming patterns according to an exemplary embodiment of the present invention, the producing of the patterns on the photoresist layer may be performed by development using conventional alkaline aqueous solutions such as a tetramethylammonium hydroxide (TMAH) developer, etc., and the removing of the underlayer film may be performed by dry etching using $CHF_3/CF_4$ mixed gas, etc., and the etching of the substrate may be performed by plasma etching using $Cl_2$ or HBr gas. Here, the etching method, etc., are not limited to the above-described methods, but may be variously changed according to process conditions.

The underlayer film formed according to the present invention is formed by the polymer including the repeating unit represented by Chemical Formula 1, having excellent heat stability, etching resistance, and coating uniformity, such that the underlayer film has excellent heat stability, etching resistance, and coating uniformity. Further, in spite of a high content of carbon in the polymer, the polymer has excellent solubility in an organic solvent, such that the polymer has significantly improved storage stability and line compatibility in a semiconductor process.

Hereinafter, the present invention will be described in detail through Examples and Comparative Examples. However, the following Examples are to illustrate the present invention, and the scope of the present invention is not limited to the following Examples.

Comparative Synthesis Example 1

35 g of 9,9-bis(hydroxyphenyl)fluorene, 20.1 g of 4,4-difluorobenzophenone, 4.4 g of pyrenol, and 34.5 g of potassium carbonate were dissolved in 240 g of dimethylacetamide in a flask, followed by stirring at 150° C. for 6 hours. When a reaction was terminated, a reaction mixture was cooled to room temperature and slowly added to an excessive amount of 2% aqueous hydrochloric acid solution, thereby precipitating a formed polymer. After the precipitated polymer was filtered, washed with an excessive amount of deionized water, and then filtered, the obtained solid ingredient was dried in a vacuum oven at 90° C. for 24 hours or more, thereby obtaining 42 g of a polymer A [corresponding to Reaction Scheme 1]. The dried polymer was analyzed using gel permeation chromatography (GPC), and as a result, a polystyrene-converted weight average molecular weight of the polymer was 3,200.

Comparative Synthesis Example 2

20 g of the polymer A obtained in Comparative Synthesis Example 1, 13.4 g of phenol, 1.7 g of toluene sulfonic acid, and 300 g of tetrahydronaphthalene were put into a flask, and a temperature was raised to 190° C., followed by stirring for 24 hours. Water formed during the reaction was removed using a Dean Stark apparatus. After the reaction was completely conducted, the reactant was cooled to room temperature, diluted with 300 g of ethyl acetate, and then, slowly added to an excessive amount of hexane/isopropyl alcohol (7/3) solution, thereby precipitating a polymer. A solid ingredient obtained by filtering the precipitated polymer was dried in a vacuum oven at 90° C. for 24 hours or more, thereby obtaining 15 g of a polymer B [corresponding to Reaction Scheme 2]. The dried polymer was analyzed using gel permeation chromatography (GPC), and as a result, a polystyrene-converted weight average molecular weight of the polymer was 3,680.

Comparative Synthesis Example 3

A reaction was carried out by the same method as in Comparative Synthesis Example 2 except for using 20.6 g of naphthol instead of 13.4 g of phenol, thereby obtaining 17 g of a polymer C [corresponding to Reaction Scheme 2]. The dried polymer was analyzed using gel permeation chromatography (GPC), and as a result, a polystyrene-converted weight average molecular weight of the polymer was 3,740.

Synthesis Example 1

10 g of the polymer B obtained in Comparative Synthesis Example 2, 1.5 g of benzylmethyl ether, 0.05 g of toluene sulfonic acid, and 60 g of xylene were put into a flask, and stirred at 130° C. for 6 hours. The reactant was cooled to room temperature, diluted by adding 60 g of ethyl acetate, and slowly added to an excessive amount of a hexane solution, thereby precipitating a synthesized polymer. A solid ingredient obtained by filtering the precipitated polymer was dried in a vacuum oven at 90° C. for 24 hours or more, thereby obtaining 8 g of a polymer D [corresponding to Reaction Scheme 3]. The dried polymer was analyzed using gel permeation chromatography (GPC), and as a result, a polystyrene-converted weight average molecular weight of the polymer was 4,100, and a substitution amount of a benzyl group was 20 to 40 mol % based on the weight average molecular weight. The substitution amount of the benzyl group may be measured through an increase in molecular weight by GPC.

Synthesis Example 2

10 g of the polymer B obtained in Comparative Synthesis Example 2, 1 g of naphthalenemethanol, 0.05 g of toluene sulfonic acid, and 60 g of xylene were put into a flask, and stirred at 130° C. for 6 hours. The reactant was cooled to room temperature, diluted by adding 60 g of ethyl acetate, and slowly added to an excessive amount of a hexane solution, thereby precipitating a synthesized polymer. A solid ingredient obtained by filtering the precipitated polymer was dried in a vacuum oven at 90° C. for 24 hours or more, thereby obtaining 7.8 g of a polymer E [corresponding to Reaction Scheme 3]. The dried polymer was analyzed using gel permeation chromatography (GPC), and as a result, a polystyrene-converted weight average molecular weight of the polymer was 4,300, and a substitution amount of a benzyl group was 20 to 35 mol % based on the weight average molecular weight. The substitution amount of the benzyl group may be measured through an increase in molecular weight by GPC.

Examples 1 to 4 and Comparative Examples 1 to 3

Underlayer film compositions were prepared according to compositions shown in the following Table 1. As a resin, one selected from polymers A to E was used.

As a crosslinking agent, 1,3,4,6-tetrakis(methoxymethyl) glycoluril represented by Chemical Formula 2 was used, and as an acid catalyst, pyridinium p-toluenesulfonate represented by Chemical Formula 10 was used. As a solvent, propylene glycol monomethyl ether acetate (PGMEA) was used.

The resin, the crosslinking agent, and the acid catalyst were dissolved in 50 g of the solvent according to the ingredients and contents shown in Table 1, and particulate impurities were completely removed using a filter (0.05 μm).

TABLE 1

| | Resin | Crosslinking Agent | Acid Catalyst |
|---|---|---|---|
| Example 1 | 5 g (D in Synthesis Example 1) | — | — |
| Example 2 | 5 g (E in Synthesis Example 2) | 0.1 g | 0.05 g |
| Example 3 | 5 g (D in Synthesis Example 1) | 0.5 g | 0.05 g |
| Example 4 | 5 g (D in Synthesis Example 1) | 0.2 g | 0.08 g |
| Comparative Example 1 | 5 g (A in Comparative Synthesis Example 1) | — | — |
| Comparative Example 2 | 5 g (B in Comparative Synthesis Example 2) | — | — |
| Comparative Example 3 | 5 g (C in Comparative Synthesis Example 3) | — | — |

Experimental Example 1

Formation of Underlayer Film

The underlayer film compositions in Examples 1 to 4 and Comparative Examples 1 to 3 were spin coated on wafers, and baked at 250° C. for 60 seconds. Thereafter, surfaces of the baked wafers were observed by the naked eyes or using scanning electron microscope (SEM), or the like. Crosslinking degrees, surface uniformity, and the presence or absence of cracks were evaluated (⊚: excellent, ○: good, Δ: fair, and X: poor) through surface observation, and the results were shown in the following Table 2.

Further, at the time of evaluating solubility, when each of the underlayer film compositions was dissolved in propylene glycol methyl ether acetate (PMA), propylene glycol methyl ether (PM), ethyl 3-ethoxypropionate (EEP), or a mixed solvent of PMA/PM (3/7(v/v)) at a content of 20 wt %, transparency of each of the solutions was evaluated (⊚: excellent, ○: good, Δ: fair, and X: poor), and the results were shown in the following Table 2.

TABLE 2

| | Crosslinking Degree | Surface Uniformity | Presence or Absence of Cracks | Solubility |
|---|---|---|---|---|
| Example 1 | ○ | ⊚ | ⊚ | ⊚ |
| Example 2 | ○ | ⊚ | ⊚ | ⊚ |
| Example 3 | ⊚ | ○ | ⊚ | ⊚ |
| Example 4 | ⊚ | ⊚ | ⊚ | ⊚ |
| Comparative Example 1 | Δ | Δ | Δ | X |
| Comparative Example 2 | ○ | ○ | ⊚ | ○ |
| Comparative Example 3 | ○ | ○ | ⊚ | ○ |

As shown in Table 2, it was confirmed that in Comparative Example 1 in which a resin made of pure polyarylketone ether was used, a large amount of fume was generated, such that cracks were observed, and surface uniformity was deteriorated. In addition, it may be appreciated that solubility was significantly deteriorated as compared to other Examples and Comparative Examples.

It may be appreciated that in Examples 1 to 4 in which the novel polymer according to the present invention was used, surface uniformity was more excellent. It may be appreciated that in Examples 1 and 2, surface uniformity was relatively improved as compared to Comparative Examples 2 and in which alkylation was not performed. In Comparative Example 1, surface uniformity was deteriorated due to poor solubility.

Experimental Example 2

Formation of Patterns

After forming an underlayer film having a thickness of 130 nm by spin-coating the underlayer film composition of Example 4 on a wafer and baking the wafer at 250° C. for 60 seconds, an ArF photoresist was coated on the underlayer film, and baked at 110° C. for 60 seconds, thereby forming a photoresist layer having a thickness of 90 nm. The photoresist layer was exposed using an ArF excimer laser scanner (NSR-S305B manufactured by Nikon Corp., numerical aperture (NA)=0.68, 0=0.85), and baked at 90° C. for 90 seconds. Then, development was performed thereon using a TMAH developer (2.38 w % aqueous solution) for 60 seconds, thereby obtaining photoresist patterns [FIG. 1]. The obtained photoresist patterns were used as an etching mask, and the underlayer film was dry etched using $CHF_3$/$CF_4$ mixed gas and then, dry etched using $BCl_3$/$Cl_2$ mixed gas again. Finally, all of the remaining organic materials were removed using $O_2$ gas.

Figure 2:
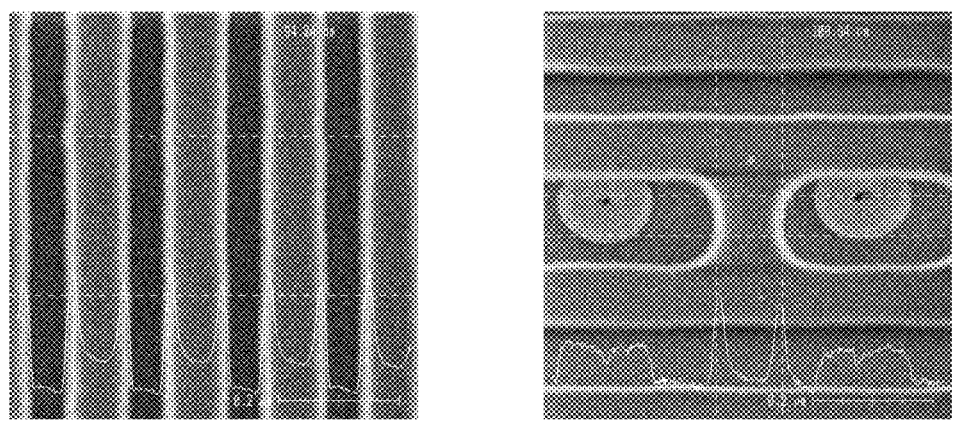
FIG. 2 shows CD point images after an etching process.

Cross-sections of the pattern obtained using field emission-scanning electron microscope (FE-SEM) after a photolithography process and an etching process using the underlayer film composition of Example 4 were illustrated in FIGS. 1 and 2, respectively. As illustrated in FIGS. 1 and 2, it may be appreciated that the underlayer film composition of Example 4 was excellent in view of pattern fidelity, CD uniformity, surface roughness, and the like.

Experimental Example 3

Acceleration Test for Storage Stability

The polymers (each 20 wt %) prepared in Synthesis Examples 1 and 2 according to the present invention were dissolved in various organic solvents in the same manner in the test for solubility in Experimental Example 1, respectively, and kept at 50° C. After 3 weeks, transparency of the solutions was observed, thereby performing an acceleration test for storage stability.

Used organic solvent: ethyl acetate (E/L), Cyclohexanone (C/H), N-methylpyrrolidone (NMP), methyl 2-hydroxy-isobutyrate (HBM), propylene glycol methyl ether acetate (PMA), propylene glycol methyl ether (PM), ethyl 3-ethoxy-propionate (EEP), or a PMA/PM (3/7(v/v)) mixed solvent.

It was confirmed that all of the polymers according to the present invention had excellent solubility in general organic solvents. In addition, as a result of the acceleration test for storage stability at 50° C., even after 3 weeks, it was confirmed that the solutions were stable without precipitation, such that the polymers had sufficiently improved storage stability.

Since the novel polymer according to the present invention simultaneously may have the optimized etch selectivity and planarization characteristics, the underlayer film composition containing the same may be used to form the hard mask (spin on carbon (SOC) hard mask) by spin coating in the multilayer semiconductor lithography process.

The underlayer film composition according to the present invention has excellent etching resistance, heat stability, and coating uniformity due to the novel polymer, and particularly, the underlayer film composition has excellent solubility in the organic solvent in spite of a high content of carbon, thereby making it possible to significantly improve storage stability and line compatibility in the semiconductor process.

Further, even in the case of forming the underlayer film using the underlayer film composition according to the present invention and then performing the photolithography process and the etching process thereon, it is possible to obtain excellent pattern fidelity, critical dimension (CD) uniformity, surface roughness, and the like.

What is claimed is:

1. A polymer comprising a repeating unit represented by the following Chemical Formula 1:

[Chemical Formula 1]

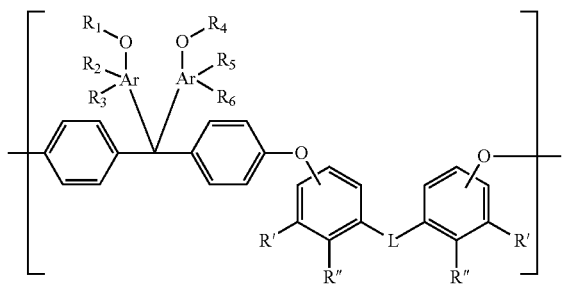

in Chemical Formula 1,

Ar is (C6-C20)arylene;

$R_1$ to $R_6$ are each independently hydrogen, (C1-C20)alkyl, nitrile, or (C6-C20)arylmethyl, at least one of $R_1$ to $R_6$ being (C6-C20)arylmethyl;

L is a single bond, (C1-C10)alkylene, or (C6-C20)arylene, alkylene and arylene of L being further substituted with one or more substituents selected from (C1-C20)alkyl, (C6-C20)aryl, and (C1-C20)alkoxy; and R' and R" are each independently hydrogen, (C1-C20)alkyl, (C1-C20)alkoxy, or (C6-C20)aryl, or are linked to each other via (C2-C10)alkenylene to form a fused ring.

2. The polymer of claim 1, wherein the polymer has a weight average molecular weight of 500 to 20,000.

3. The polymer of claim 2, wherein a substitution amount of (C6-C20)aralkyl in the polymer is 10 to 50 mol % based on the weight average molecular weight of the polymer.

4. The polymer of claim 1, wherein Ar is phenylene, naphthylene, or anthrylene; $R_1$ to $R_6$ are each independently hydrogen, methyl, nitrile, benzyl, naphthylmethyl, anthrylmethyl, or pyrenylmethyl; L is a single bond,

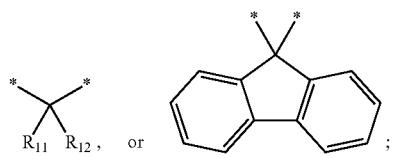

$R_{11}$ and $R_{12}$ are each independently methyl, ethyl, propyl, or phenyl; R' and R" are each independently hydrogen or are linked to each other via C4alkenylene to form a fused ring.

5. The polymer of claim 1, wherein Ar is phenylene or naphthylene; $R_1$ to $R_6$ are each independently hydrogen or benzyl; L is

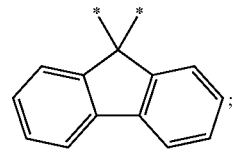 [SMILES: *C1(*)c2ccccc2-c2ccccc21]

and R' and R" are each independently hydrogen or are linked to each other via C4alkenylene to form a fused ring.

6. An underlayer film composition for semiconductor and display manufacturing processes, the underlayer film composition comprising a polymer including a repeating unit represented by the following Chemical Formula 1:

[Chemical Formula 1]

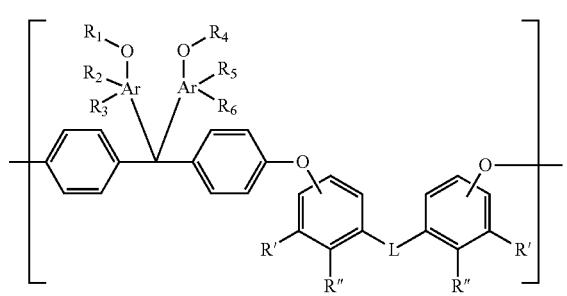

in Chemical Formula 1,

Ar is (C6-C20)arylene;

$R_1$ to $R_6$ are each independently hydrogen, (C1-C20)alkyl, nitrile, or (C6-C20)arylmethyl, at least one of $R_1$ to $R_6$ being (C6-C20)arylmethyl;

L is a single bond, (C1-C10)alkylene, or (C6-C20)arylene, alkylene and arylene of L being further substituted with one or more substituents selected from (C1-C20)alkyl, (C6-C20)aryl, and (C1-C20)alkoxy; and R' and R" are each independently hydrogen, (C1-C20)alkyl, (C1-C20)alkoxy, or (C6-C20)aryl, or are linked to each other via (C2-C10)alkenylene to form a fused ring.

7. The underlayer film composition of claim 6, wherein a content of the polymer is 1 to 50 wt % based on total amount of the underlayer film composition.

8. The underlayer film composition of claim 6, further comprising at least one additive selected from crosslinking agents, acid catalysts, acid generators, antifoaming agents, and surfactants.

9. The underlayer film composition of claim 8, wherein the crosslinking agent is at least one selected from compounds represented by Chemical Formulas 2 to 8 below:

[Chemical Formula 2]

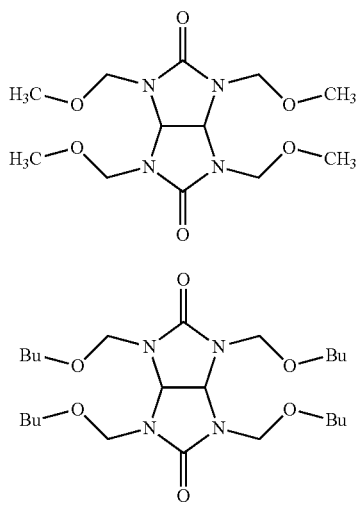

[Chemical Formula 3]

[Chemical Formula 4]

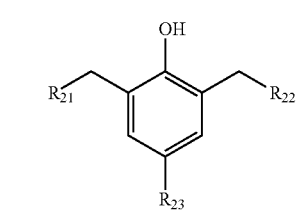

in Chemical Formula 4, $R_{21}$ and $R_{22}$ are each independently hydroxyl, (C1-C3)alkoxy, and $R_{23}$ is (C1-C10)alkyl,

[Chemical Formula 5]

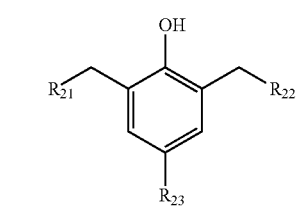

[Chemical Formula 6]

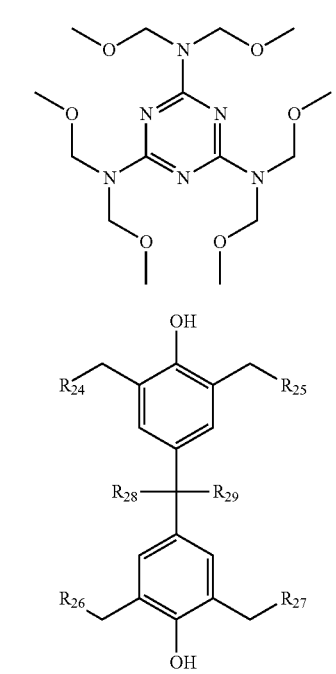

in Chemical Formula 6, $R_{24}$ to $R_{27}$ are each independently hydroxyl or (C1-C3)alkoxy, and $R_{28}$ and $R_{29}$ are each independently hydrogen, (C1-C10)alkyl, or halo(C1-C10)alkyl,

[Chemical Formula 7]

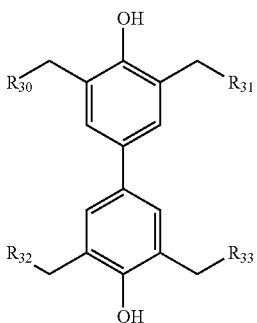

in Chemical Formula 7, $R_{30}$ to $R_{33}$ are each independently hydroxyl or (C1-C3)alkoxy, and

[Chemical Formula 8]

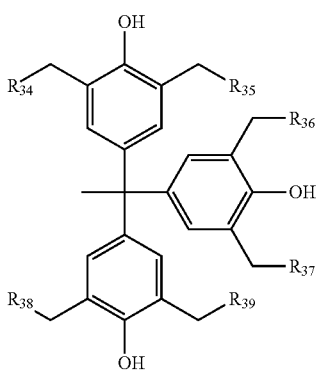

in Chemical Formula 8, $R_{34}$ to $R_{39}$ are each independently hydroxyl or (C1-C3)alkoxy.

10. The underlayer film composition of claim 8, wherein the acid catalyst or the acid generator is at least one selected from compounds represented by Chemical Formulas 9 to 14 below:

[Chemical Formula 9]

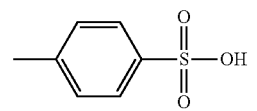

[Chemical Formula 10]

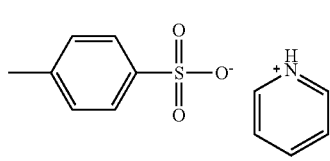

[Chemical Formula 11]

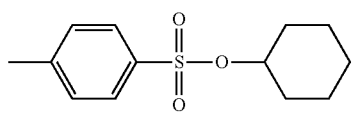

[Chemical Formula 12]

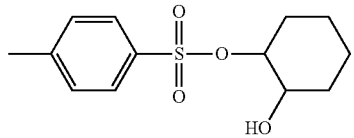

[Chemical Formula 13]
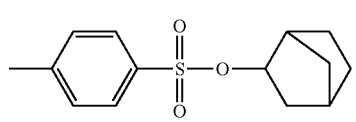
[Chemical Formula 14]
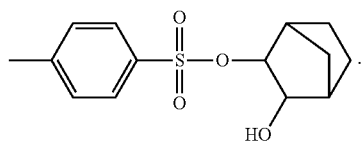
11. A method for forming an underlayer film for semiconductor and display manufacturing processes, the method comprising:
   applying the underlayer film composition of claim 6 on a wafer; and
   baking the wafer on which the underlayer film composition is applied.
* * * * *